(12) United States Patent
Kuga et al.

(10) Patent No.: US 6,551,448 B2
(45) Date of Patent: Apr. 22, 2003

(54) HEAT PROCESSING APPARATUS OF SUBSTRATE

(75) Inventors: Yasuhiro Kuga, Kumamoto (JP); Mitsuhiro Tanoue, Kumamoto (JP); Kouichirou Tanaka, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 18 days.

(21) Appl. No.: 09/800,465

(22) Filed: Mar. 8, 2001

(65) Prior Publication Data

US 2001/0053507 A1 Dec. 20, 2001

(30) Foreign Application Priority Data

Mar. 9, 2000 (JP) ........................................ 2000-064885

(51) Int. Cl.[7] .............................. H05H 1/00; C23C 16/00
(52) U.S. Cl. ............................ 156/345.51; 156/345.52; 118/728; 118/725; 118/724
(58) Field of Search ..................... 156/345.52, 345.51; 118/725, 728, 724, 729, 723 E; 438/689, 715; 427/587, 592; 219/121.4, 411, 496, 391, 390; 392/309

(56) References Cited

U.S. PATENT DOCUMENTS

| 4,448,659 A | * | 5/1984 | Morrison, Jr. | ......... 204/192.38 |
| 4,485,000 A | * | 11/1984 | Kawaguchi et al. | ... 204/298.12 |
| 6,239,402 B1 | * | 5/2001 | Araki et al. | ............. 219/121.4 |

FOREIGN PATENT DOCUMENTS

| JP | 58-28828 A | * | 2/1983 | ......... H01L/21/205 |
| JP | 11-297683 A | * | 10/1999 | ........... H01L/21/31 |

* cited by examiner

Primary Examiner—Gregory Mills
Assistant Examiner—P. Hassanzadeh
(74) Attorney, Agent, or Firm—Oblon, Spivak, McClelland, Maier & Neustadt, P.C.

(57) ABSTRACT

The present invention is an apparatus for operating heat processing to a substrate, and comprises a heating plate to mount and heat the substrate thereon, a supporting member to support a lower surface of a periphery of the heating plate, and a supporter to support the supporting member. The supporting member has a stepped portion to surround an outer peripheral surface of the heating plate. The supporting member is fixed to the supporter by a fixing member penetrating through the stepped portion in a vertical direction. The fixing member is provided between an inner peripheral surface of the stepped portion and the outer peripheral surface of the heating plate.

According to the present invention, since the fixing member is provided between the outer peripheral surface of the heating plate and the inner peripheral surface of the stepped portion, the supporting member does not exist between the fixing member and the outer peripheral surface of the heating plate. Therefore, even when the heating plate is cooled, a part of the supporting member does not shrink toward the heating plate side, contrary to the conventional art. Thus, it is prevented that the part of the supporting member partially compresses the heating plate to distort the heating plate.

20 Claims, 16 Drawing Sheets

HEAT PROCESSING APPARATUS OF SUBSTRATE

BACKGROUND OF THE INVENTION

1. Field of the Invention

This invention relates to a heat processing apparatus of a substrate.

2. Description of the Related Art

In a process of photo resist processing in fabricating a semiconductor device, various heat processings are operated such as heat processing after coating a resist solution onto a surface of a semiconductor wafer (hereinafter referred to as "wafer") (prebaking), heat processing after an exposure of a pattern (post-exposure baking) and so on.

These heat processings are usually operated in heat processing apparatuses. The heat processing apparatus has a circular-shaped heating plate 150 to mount and heat the wafer W thereon in a process container (not-shown) as shown in FIG. 13 and FIG. 14, and a heater (not-shown) is embedded in the heating plate 150. The heating plate 150 is usually supported by an annular-shaped supporting member 151 which is excellent in heat insulting property and supports a lower surface of a periphery thereof, and the supporting member 151 has a stepped portion 151a which surrounds an outer peripheral surface of the heating plate 150 for positioning the heating plate 150. Further, the supporting member 151 is supported by a supporting table 152 which supports a lower surface of the supporting member 151, and the supporting member 151 is fixed to the supporting table 152 by a plurality of bolts 153 which penetrate through the stepped portion 151a in a vertical direction.

The heat processing of the wafer W is operated by thuss-structured apparatus at a predetermined temperature, but the temperature of the heating plate 150 may be changed in changing a recipe of the process and the like. In the case like this, the heating plate 150 is usually cooled temporarily. At this moment, the supporting member 151 which is expanded outwardly by heat of the heating plate 150 when being heated is cooled to shrink inwardly.

However, as described above, since the supporting member 151 is fixed to the supporting table 152 by the bolts 153, areas which are not fixed by the bolts 153 (the diagonally shaded areas in FIG. 15) as shown in FIG. 15 are expanded more than fixed areas when it is heated. Thereafter, when it is cooled, the areas which are not fixed by the bolts 153 shrink to these original positions, but at the areas which are fixed by the bolts 153, parts 151a of the supporting member 151 which are placed on inner sides of the bolts 153 shrink inwardly, as shown in FIG. 16. Therefore, there are cases in which the heating plate 150 is partially compressed by the shrinking of the parts 151a of the supporting member 151 to distort its shape. In this case, harmful effects such as uneven temperature on a surface of the heating plate 150 occur, and there is a possibility that the heating of the wafer W is not operated preferably.

SUMMARY OF THE INVENTION

The present invention is made in view of the above circumstances, and its object is to prevent an occurrence of distortion of a heating plate by being partially compressed, even when a supporting member shrinks when it is cooled in a heat processing apparatus of a substrate.

To attain the above-mentioned object, according to a first aspect of the present invention, the present invention is an apparatus for operating heat processing to a substrate, comprising a heating plate to mount and heat the substrate thereon, a supporting member to support a lower surface of a periphery of the heating plate, and a supporter to support the supporting member, wherein the supporting member has a stepped portion to surround an outer peripheral surface of the heating plate, wherein the supporting member is fixed to the supporter by a fixing member penetrating through the stepped portion in a vertical direction, and wherein a peripheral surface of the fixing member on a side to be opposed to the outer peripheral surface of the heating plate is exposed toward a heating plate side.

According to another aspect of the present invention, the present invention is an apparatus for operating heat processing to a substrate, comprising a heating plate to mount and heat the substrate thereon, a supporting member to support a lower surface of a periphery of the heating plate, and a supporter to support the supporting member, wherein the supporting member has a stepped portion to surround an outer peripheral surface of the heating plate, wherein the supporting member is fixed to the supporter by a fixing member penetrating through the stepped portion in a vertical direction, and wherein the fixing member is provided between an inner peripheral surface of the stepped portion and the outer peripheral surface of the heating plate.

According to still another aspect of the present invention, the present invention is an apparatus for operating heat processing to a substrate, comprising a heating plate to mount and heat the substrate thereon, a supporting member to support a lower surface of a periphery of the heating plate, and a supporter to support the supporting member, wherein the supporting member has a stepped portion to surround an outer peripheral surface of the heating plate, wherein the supporting member is fixed to the supporter by a fixing member penetrating through the stepped portion in a vertical direction, and wherein the fixing member is adjacently provided outside the outer peripheral surface of the heating plate. Incidentally, providing the fixing member adjacently outside the outer peripheral surface of the heating plate means that a part of the supporting member does not exist between the fixing member and the outer peripheral surface of the heating plate as its consequence.

According to yet another aspect of the present invention, the present invention is an apparatus for operating heat processing to a substrate, comprising a heating plate to mount and heat the substrate thereon, a supporting member having a stepped portion to surround an outer peripheral surface of the heating plate, to support a lower surface of a periphery of the heating plate, and a supporter to support the supporting member, the supporting member including a through-hole penetrating in a horizontal direction from an outside of the stepped portion toward an inside thereof, and the apparatus further comprising a fixing member being fixed to the supporting member by penetrating through the through-hole to fix the heating plate by pressing its outer peripheral surface.

According to the present invention, by providing the fixing member with its peripheral surface exposed to the heating plate side, the part of the supporting member does not exist between the outer peripheral surface of the heating plate and the fixing member, contrary to the conventional art, and even when the heating plate is cooled, the part of the supporting member does not shrink toward the heating plate side, contrary to the conventional art. Thus, it is prevented that the part of the supporting member partially compresses the heating plate to distort the heating plate.

According to the present invention, by providing the fixing member between the outer peripheral surface of the heating plate and the inner peripheral surface of the stepped portion, the supporting member does not exist between the fixing member and the outer peripheral surface of the heating plate, and even when the heating plate is cooled, the part of the supporting member does not shrink toward the heating plate side, contrary to the conventional art. Thus, it is prevented that the part of the supporting member partially compresses the heating plate to distort the heating plate.

According to the present invention, by adjacently providing the fixing member outside the outer peripheral surface of the heating plate, the outer peripheral surface of the heating plate is not partially compressed by the shrinking of the supporting member. Therefore, even when the heating plate is cooled, the heating plate is prevented from distorting.

According to the present invention, by providing the fixing member horizontally, expansion/contraction of the supporting member which extends mainly in the horizontal direction by the heat is not restrained by the fixing member, and hence it is prevented that the supporting member partially shrinks to distort the heating plate partially, contrary to the conventional art. Moreover, the fixing member holds the outer peripheral surface of the heating plate, so that the heating plate is fixed to a predetermined position and an erroneous deviation thereof is prevented.

In this invention, it is preferable to provide a collar to an outer periphery of the fixing member. By attaching the collar to the fixing member, it is prevented that the fixing member contacts the supporting member directly, thereby inhibiting harmful effects due to the heat of the supporting member and the heating plate, for example, an effect of losing the strength of the fixing member due to fatigue or the like. Furthermore, it is prevented that the fixing member and the supporting member or the heating plate contact directly to generate particles by friction thereof.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

Figure 1:
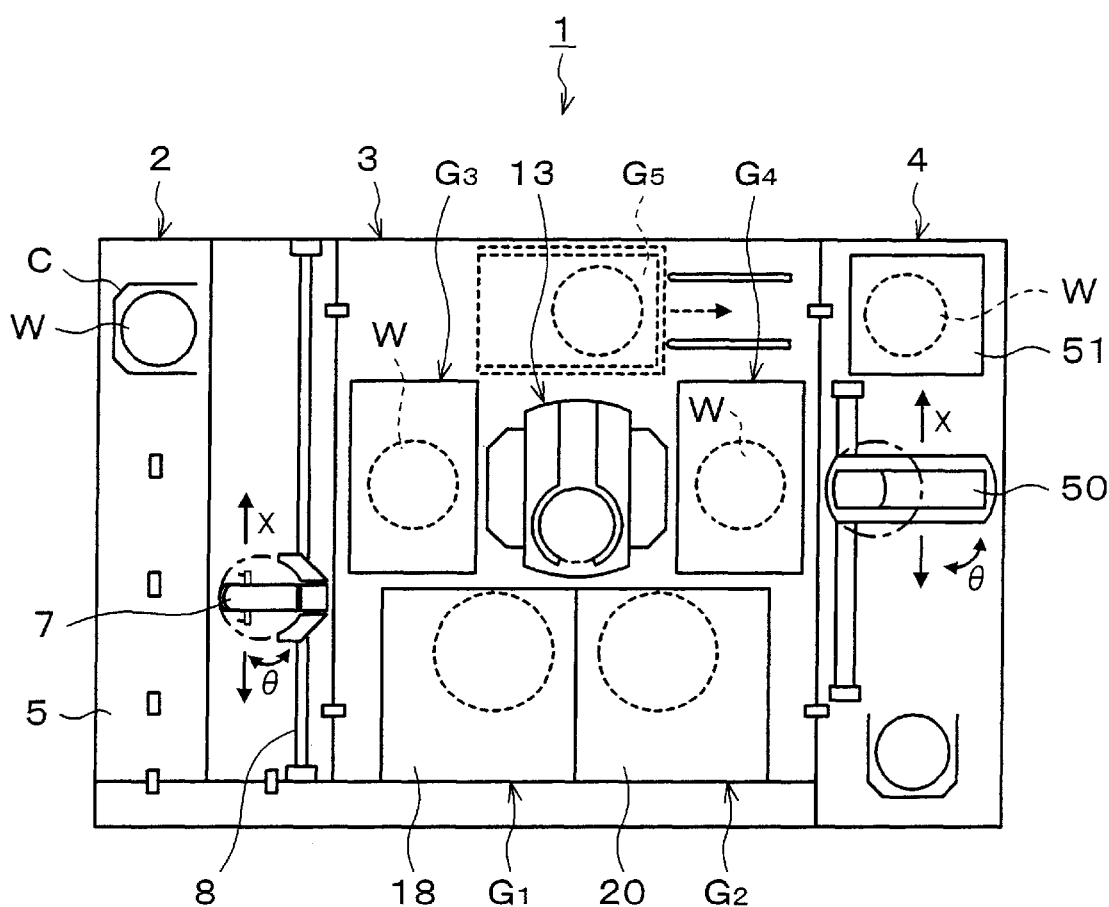
FIG. 1 is a plane view schematically showing the structure of a coating and developing system having a post-exposure baling unit according to an embodiment of the present invention.
Figure 2:
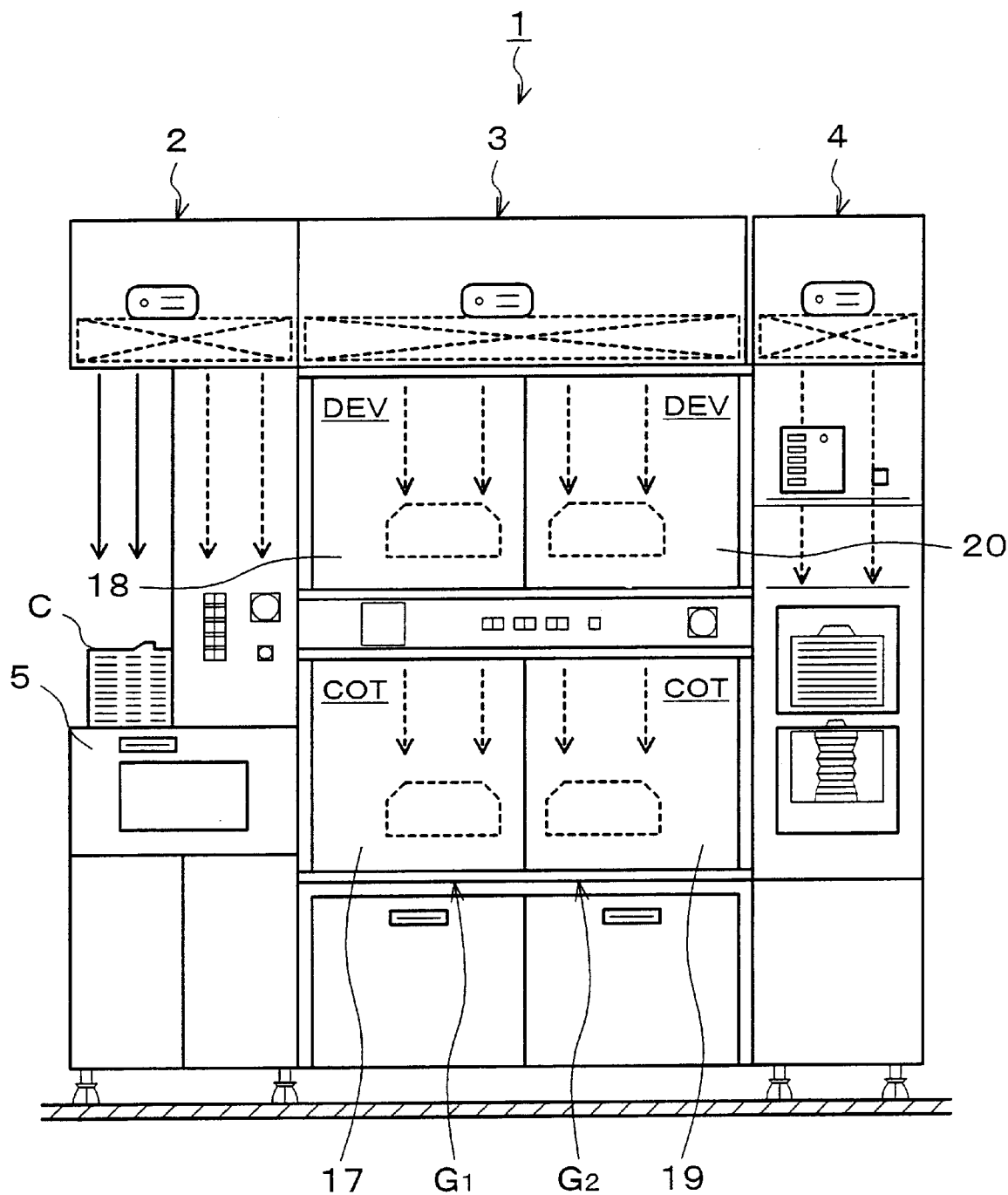
FIG. 2 is a front view of the coating and developing system in FIG. 1.
Figure 3:
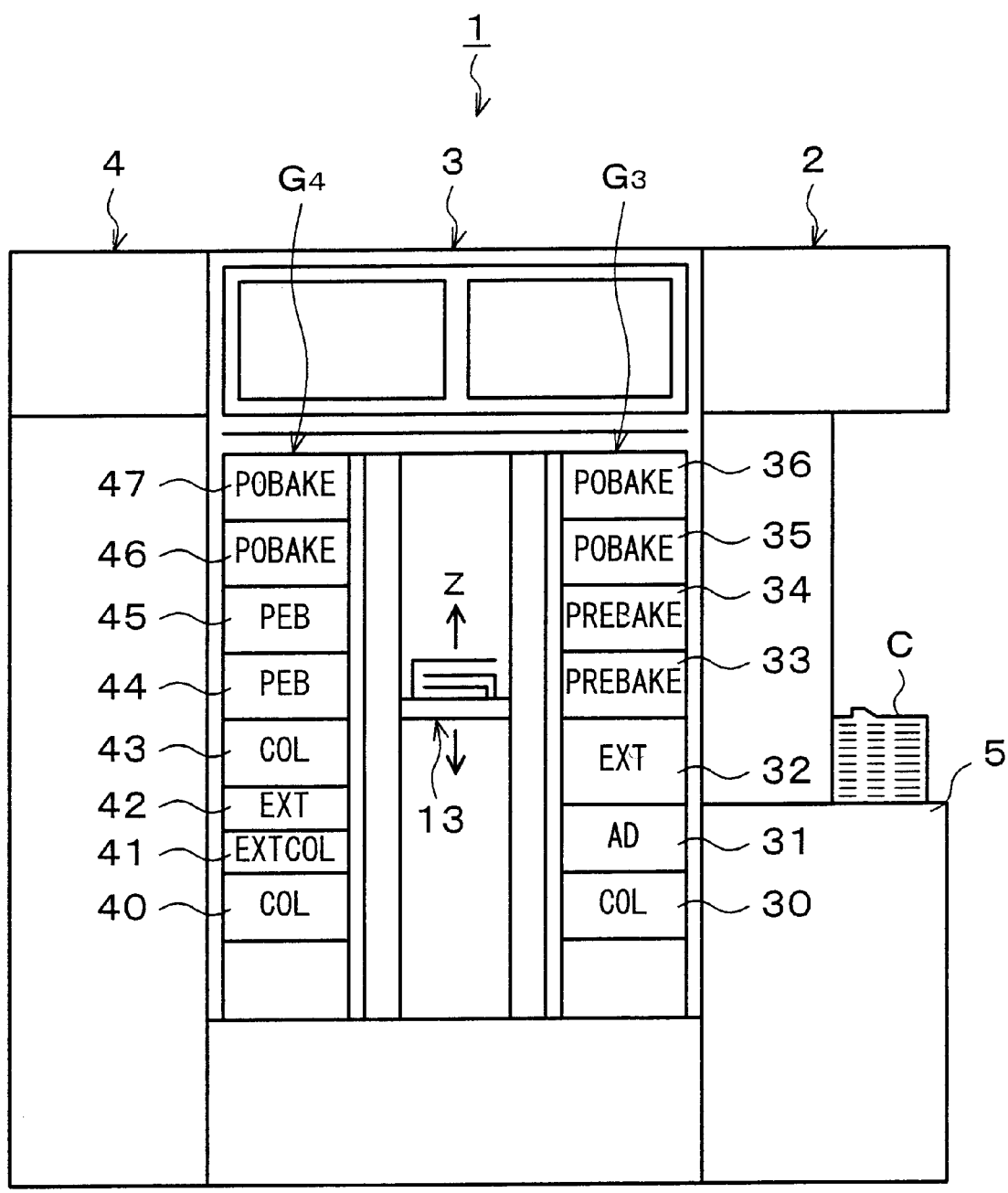
FIG. 3 is a rear view of the coating and developing system in FIG. 1.

Hereinafter, the preferred embodiment of the present invention will be explained. FIG. 1 is a plane view of a coating and developing system 1 having a heating unit according to this embodiment, FIG. 2 is a front view of the coating and developing system 1, and FIG. 3 is a rear view of the coating and developing system 1.

The coating and developing system 1, as shown in FIG. 1, has a structure in which a cassette station 2 which carries, for example, 25 wafers W in a cassette into/out of the coating and developing system 1 from/to the outside and carries the wafer W into/out of a cassette C, a process station 3 in which various process units are disposed in multiple layers for operating predetermined processings in a single wafer type in a coating and developing process and an interface section 4 which delivers the wafer W from/to a not-shown exposure unit provided next to the process station 3 are integrally connected.

In the cassette station 2, a plurality of the cassettes C are freely mounted in an X direction (in a top and bottom direction in FIG. 1) in a line at predetermined positions on a cassette mounting table 5 as a mounting section. Further, a wafer carrier 7 which can be transported to the cassette alignment direction (X direction) and a wafer alignment direction (Z direction; a vertical direction) of the wafer W housed in the cassette C is provided to be movable along a carrier path 8, and is accessible selectively to the respective cassettes C.

The wafer carrier 7 has an alignment function for performing alignment of the wafer W. This wafer carrier 7 is also structured to be accessible to an extension unit 32 which belongs to a third process unit group G3 of the process station 3 side, as will be described later.

In the process unit 3, a main carrier device 13 is provided in its center part, and various process units are disposed in multiple layers to structure process unit groups in the periphery around the main carrier device 13. In this coating and developing system 1, the four process unit groups G1, G2, G3 and G4 are disposed, in which a first and a second process unit groups G1 and G2 are disposed in the front side of the coating and developing system 1, the third process unit group G3 is disposed next to the cassette station 2, and a fourth process unit group G4 is disposed next to the interface section 4. Further, a fifth process unit group G5 can be optionally disposed in the rear side, as shown in a broken line. The main carrier device 13 can carry the wafer W into/out of the later described various process units which are disposed in the process unit groups G1 to G5.

In the first process unit group G1, for example as shown in FIG. 2, a resist coating unit 17 for coating the wafer W with a resist solution and a developing unit 18 for processing the wafer W by supplying a developing solution thereon are two-tiered from the bottom in order. Similarly in the second process unit group G2, a resist coating unit 19 and a developing unit 20 are two-tiered from the bottom in order.

In the third process unit group G3, for example as shown in FIG. 3, a cooling unit 30 for operating cooling processing to the wafer W, an adhesion unit 31 for enhancing adhesion properties of the resist solution and the wafer W, the extension unit 32 for making the wafer W on standby, prebaking units 33, 34 for drying a solvent in the resist solution, post-baking units 35, 36 for operating heat processing to the wafer W after developing treatment, and the like are, for example, seven-tiered from the bottom in order.

In the fourth process unit group G4, for example, a cooling unit 40, an extension and cooling unit 41 for naturally cooling the mounted wafer W, an extension unit 42, a cooling unit 43, post-exposure baking units 44, 45 as heating units according to this embodiment (PEB in FIG. 3), post-baking units 46, 47, and the like are, for example, eight tiered from the bottom in order.

A wafer carrier 50 is provided in the center part of the interface section 4. This wafer carrier 50 is structured to be movable in the X direction (in the top and bottom direction in FIG. 1) and the Z direction (the vertical direction), and to be rotatable in a θ direction (a rotating direction around a Z axis), and to be accessible to the extension and cooling unit 41 and the extension unit 42 which belong to the fourth process unit group G4, and a peripheral exposure unit 51 and the not-shown exposure unit.

Figure 4:
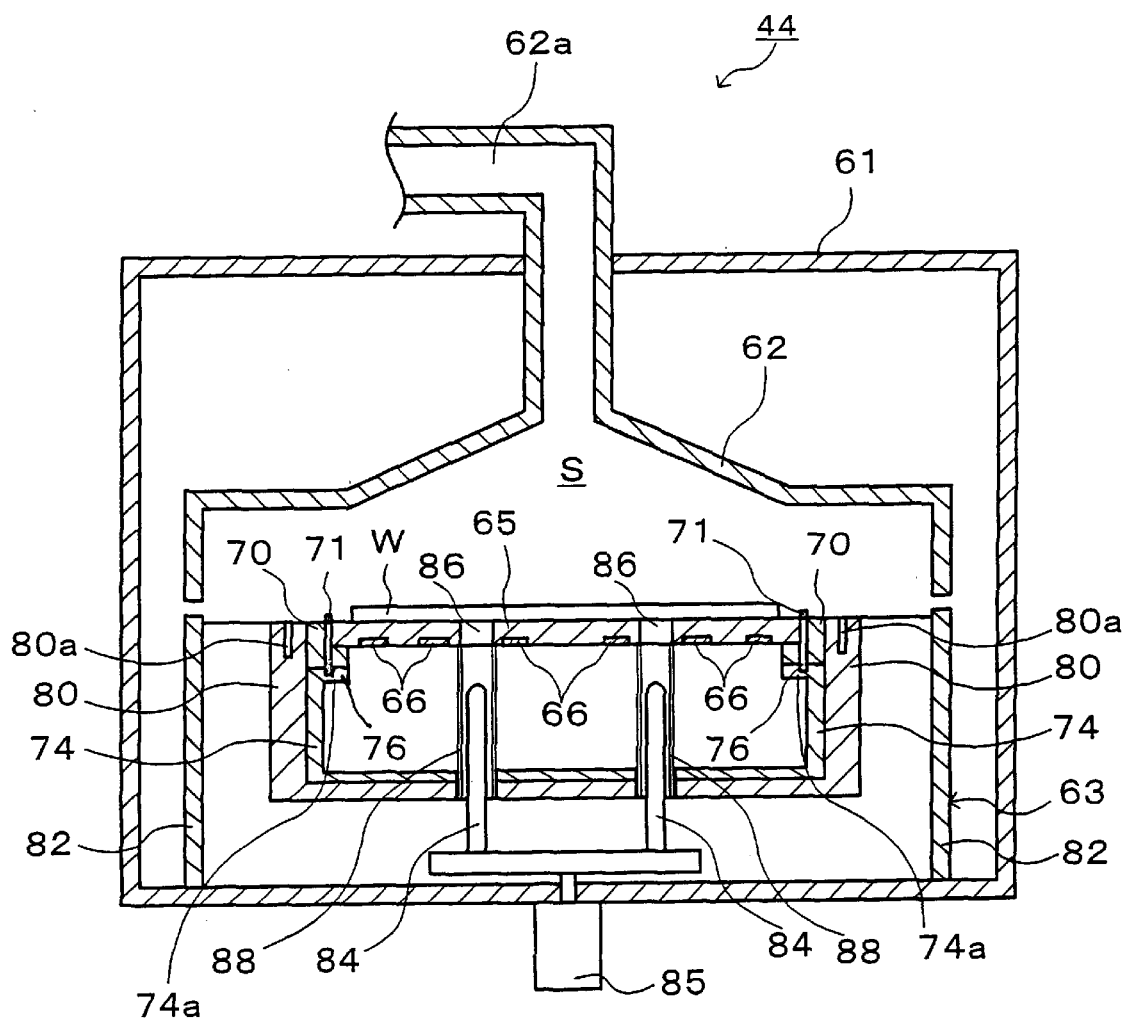
FIG. 4 is an explanatory view of a vertical section of the post-exposure baking unit according to the embodiment.

Next, the structure of the aforesaid post-exposure baking unit 44 will be explained. As shown in FIG. 4, a casing 61 of the post-exposure baking unit 44 has a lid body 62 which is placed on its upper side and is movable vertically and a heating plate accommodating section 63 which is placed on its lower side and forms a process chamber S integrally with the lid body 62.

The lid body 62 has an almost conical shape which increases its height toward its center part, and an exhaust portion 62a is provided on the top thereof. Further, an atmosphere in the process chamber S is allowed to be exhausted uniformly from the exhaust portion 62a.

Meanwhile, in the heating plate accommodating section 63, a circular-shaped heating plate 65 which mounts and heats the wafer W and has a thickness of, for example, about 1 mm to 20 mm, more preferably about 2 mm to 5 mm is provided in the center thereof. The heating plate 65 has heaters 66 as heat sources. The heaters 66 are disposed according to a predetermined pattern, for example, concentrically, and controlled by a not shown control unit so that a temperature of the heating plate 65 is in a predetermined manner.

Figure 5:
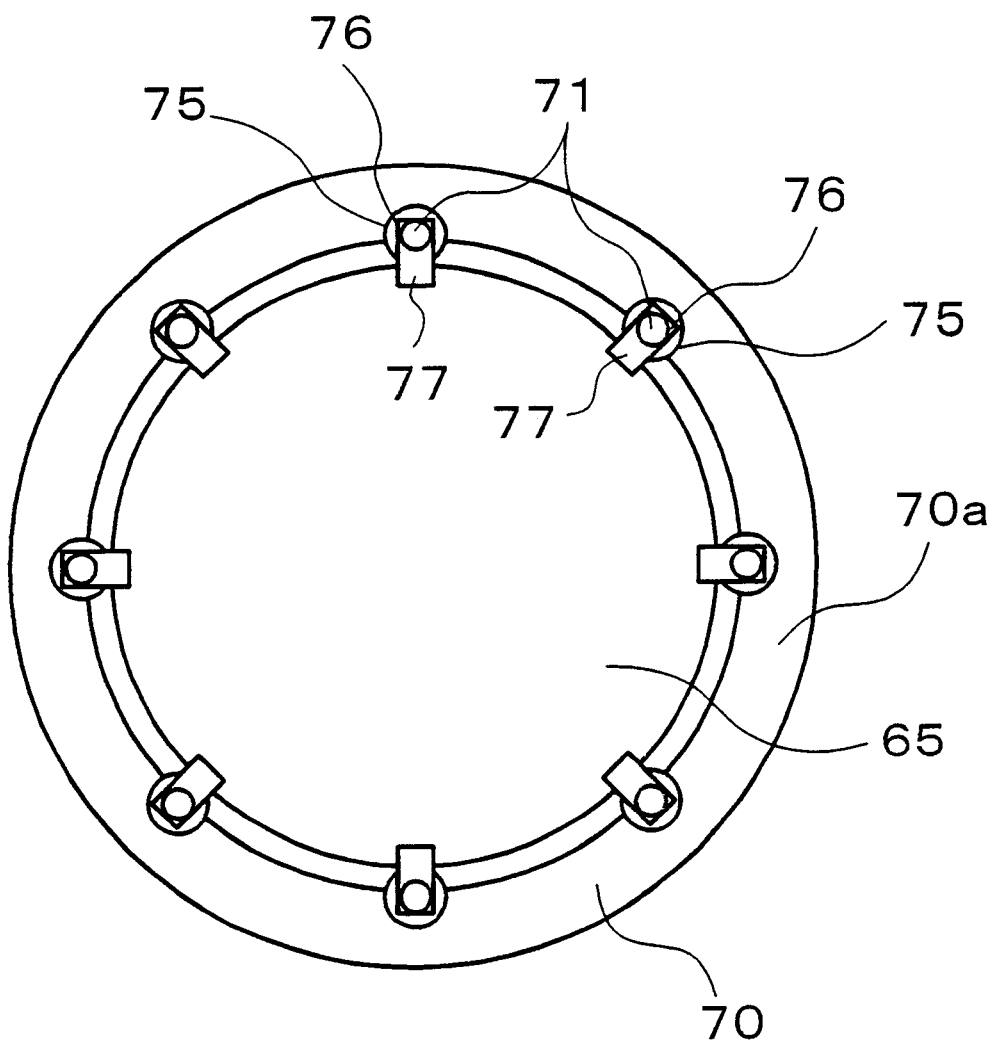
FIG. 5 is a plane explanatory view of a heating plate and a supporting member in the post-exposure baking unit used in the embodiment.
Figure 6:
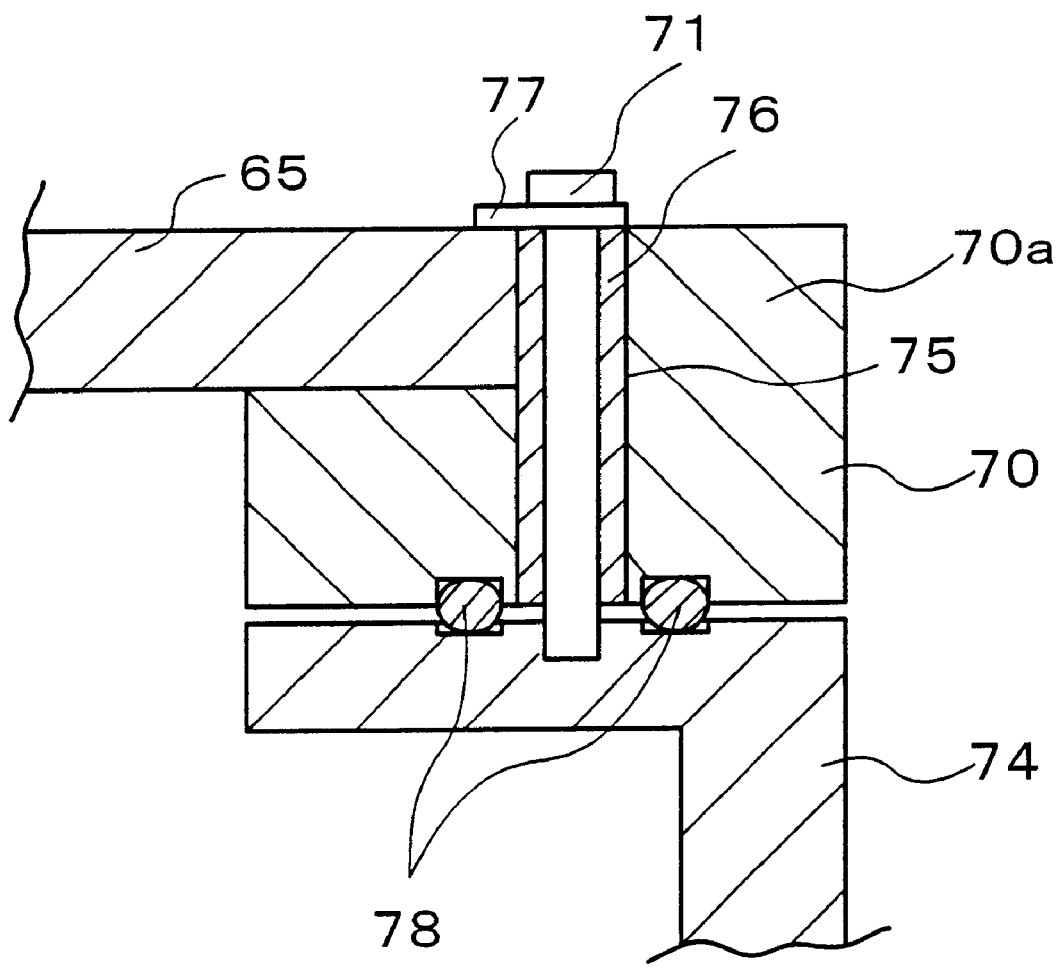
FIG. 6 is an explanatory view of an enlarged vertical section of a fixing portion of the supporting member and a supporter in the post-exposure baking unit.

As shown in FIG. 4 to FIG. 6, the heating plate 65 is supported by an annular-shaped supporting member 70 which supports the lower surface of the periphery thereof. In order to prevent a deviation of the heating plate 65 in a horizontal direction, the supporting member 70 has an annular-shaped stepped portion 70a in such a manner to surround an outer peripheral surface of the heating plate 65.

Figure 7:
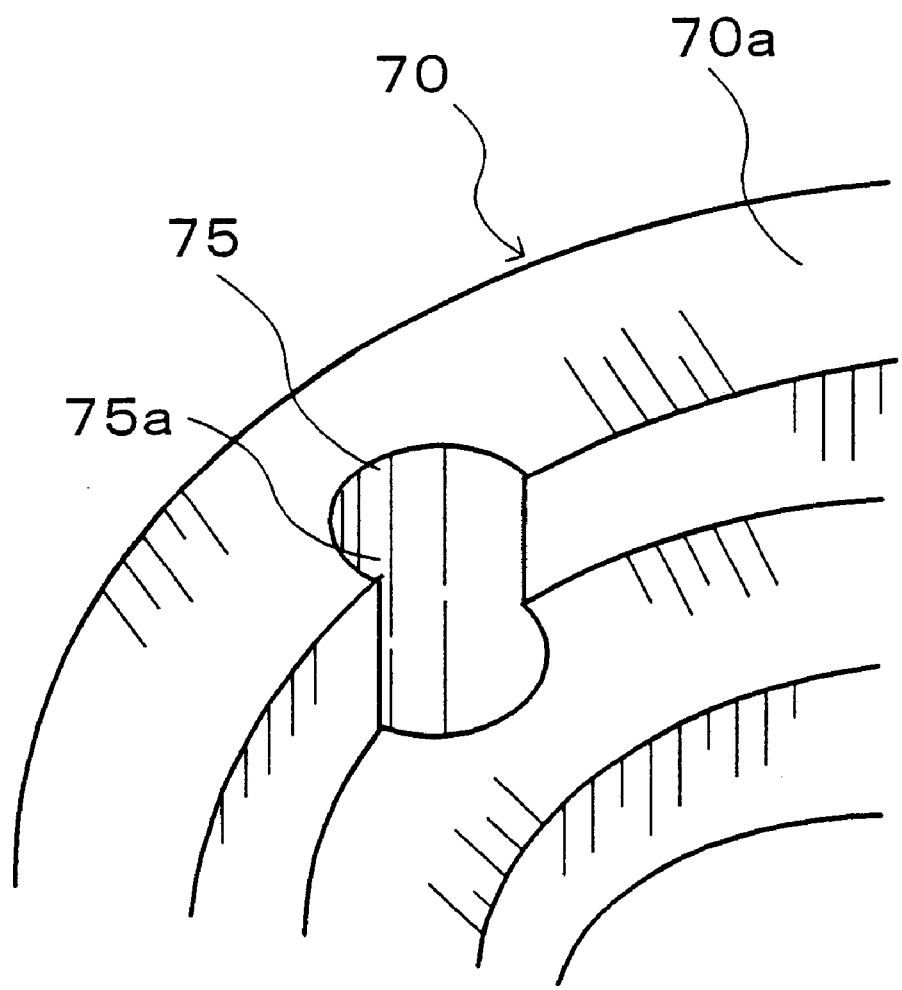
FIG. 7 is a perspective. view of the supporting member schematically showing an area in which a through-hole is provided.
Figure 8:
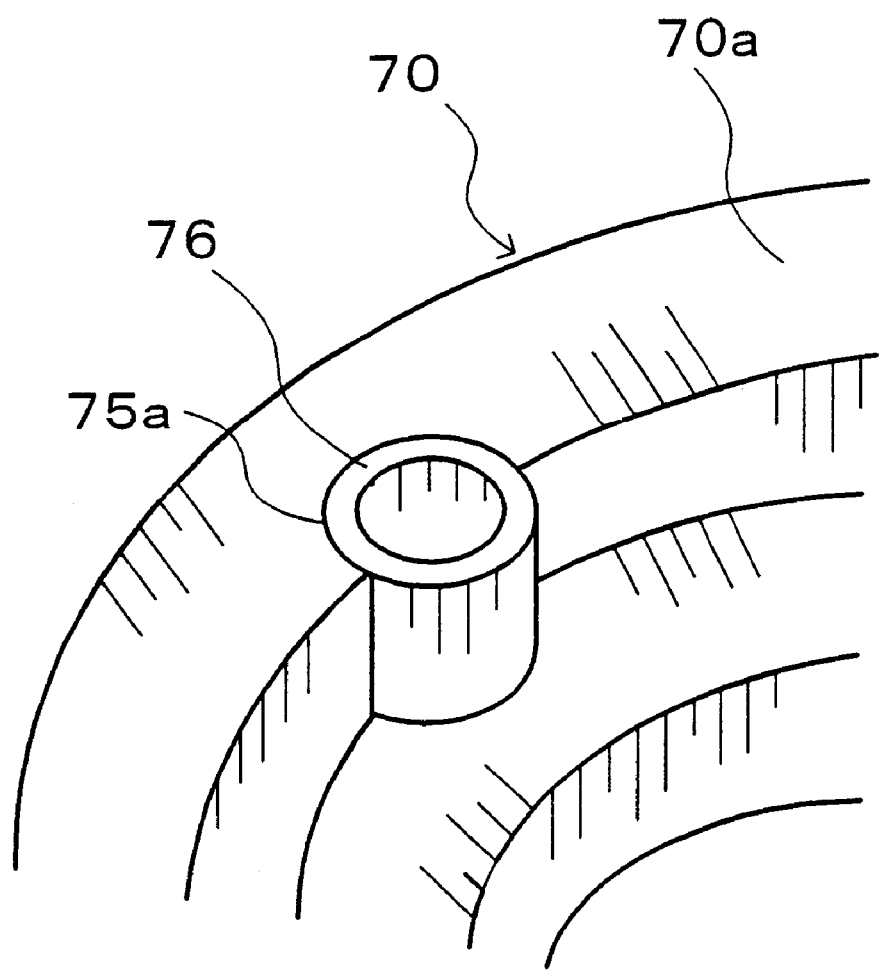
FIG. 8 is a perspective view showing a case in which a collar is provided to the through-hole in FIG. 7.

The supporting member 70 is formed by using, for example, PTFE (polytetrafluoroethylene) in order to perform a function as a heat insulting material which keeps the temperature of the heating plate 65. The supporting member 70 has a plurality of through-holes 75 through which bolts 71 as fixing members penetrate in a vertical direction, as shown in FIG. 5. As shown in FIG. 7, these through-holes 75 are provided in the vertical direction at an inner peripheral surface of the stepped portion 70a which opposes to the outer peripheral surface of the heating plate 65. As shown in FIG. 8, cylindrical collars 76 are fit into the through-holes 75 so as to keep a predetermined distance between the supporting member 70 and outer peripheries of the bolts 71.

Incidentally, a cut-out portion 75a which corresponds to an outer shape of the collar 76 is formed in each of the through-holes 75, and a part of an outer periphery of the collar 76 is provided to protrude inwardly from the inner peripheral surface of the stepped portion 70a. As a material of the collar 76, for example, PTFE (polytetrafluoroethylene) which is excellent in heat insulting property is used. When a polyimide resin having a small thermal expansion coefficient is used as the material of the collar 76, the collar 76 itself is less deformed, which is more preferable. Moreover, since the polyimide resin is hard, it is able to hold the heating plate 65 stably.

The supporting member 70 is fixed to a later-described supporter 74 by the bolts 71 penetrating through the through-holes 75 which are provided in the inner peripheral surface of the stepped portion 70a as described above. That is, peripheral surfaces of the bolts 71 on the heating plate side are provided to be exposed toward the heating plate side, and the supporting member 70 is fixed to the supporter 74 so that a part of the supporting member 70 does not exist between the bolts 71 and the outer peripheral surface of the heating plate 65, contrary to the conventional art. Further, as shown in FIG. 5, holding plates 77 are provided between respective top parts of the bolts 71 and the stepped portion 70a, and the upper surface of the periphery of the heating plate 65 is held by the holding plates 77 so that a position deviation of the heating plate 65 is inhibited.

As shown in FIG. 5, each of the collars 76 is provided so that a part of the outer periphery of the collar 76, that is, the closest part to the heating plate 65 contacts the heating plate 65, and the heating plate 65 is held from the outside by the plurality of the collars 65. Thereby, the heating. plate 65 is positioned and an erroneous deviation of the heating plate 65 is prevented.

The supporter 74 which supports the supporting member 70 is formed in an almost cylindrical shape with an opening having a flange portion 74a on its upper surface, as shown in FIG. 4. Further, as described above, the supporting member 70 is fixed to the supporter 74 with the bolts 71.

At a contact surface of the supporting member 70 and the supporter 74, as shown in FIG. 6, O-rings 78 which have elasticity are provided as intermediate members inside/outside the through-holes 75, respectively. Since the O-rings 78 have the elasticity, even when the supporting member 70 or the supporter 74 is distorted by a cause of some kind, they can absorb the distortion and relieve its displacement amounts. Therefore, when the supporting member 70 or the supporter 74 is distorted in the vertical direction by an influence of heat or the like, its displacement amount is suppressed to a minimum by the O-rings 78.

The heating plate accommodating section 63 has a support ring 80 in an almost cylindrical shape, which surrounds the supporting member 70 and the supporter 74, as shown in FIG. 4. In the support ring 80, blow-out ports 80a are provided for jetting out, for example, an inert gas toward the process chamber S, thereby allowing to purge inside the process chamber S. Further, outside the support ring 80, a cylindrical case 82 which makes an outer periphery of the heating plate accommodating section 63 is provided.

Inside the heating plate accommodating section 63, a plurality of hoisting and lowering pins 84 for holding and hoisting/lowering the wafer W when carrying in/out the wafer W are provided. The hoisting and lowering pins 84 are allowed to be vertically movable by a hoisting and lowering drive mechanism 85, and structured to be able to penetrate the heating plate 65 from the underneath of the heating plate 65 to protrude onto the heating plate 65. Therefore, holes 86 which allow the hoisting and lowering pins 84 to protrude are provided in the heating plate 65. Further, cylindrical guides 88 for protecting the hoisting and lowering pins 84 from other heat-producing members are attached on the periphery around the hoisting and lowering pins 84.

Next, an operative sequence of the post-exposure baking unit 44 which is structured as above is explained with a photolithography process which is carried out in the coating and developing system 1.

First, the wafer carrier 7 removes one unprocessed wafer W from the cassette C and carries it into the adhesion unit 31 which belongs to the third process unit group G3. The wafer W, coated with an adhesion reinforcing agent such as HMDS for enhancing adhesion property with the resist solution in the adhesion unit 31, is carried into the cooling unit 30 by the main carrier device 13 to be cooled to a predetermined temperature. Thereafter, the wafer W is carried to the resist coating unit 17 or 19 and the prebaking unit 34 or 35 in due order to be subjected to the predetermined processings. Then, the wafer W is carried into the extension and cooling unit 41.

Subsequently, the wafer W is removed from the extension and cooling unit 41 by the wafer carrier 50 to be carried into the exposure unit (not shown) through the peripheral exposure unit 51. The wafer W after the exposure processing is carried into the extension unit 42 by the wafer carrier 50 to be held by the main carrier device 13. Then, the wafer W is carried into the post-exposure baking unit 44 or 45 to be subjected to the heat processing.

Further, the wafer W after the heat processing is transferred to the cooling unit 43, the developing unit 18 or 20, the post-baking unit 35 and the cooling unit 30 by the main carrier device 13 in due order to be subjected to the predetermined processings in the respective units. Thereafter, the wafer W is returned to the cassette C through the extension unit 32 by the wafer carrier 7, and a series of the predetermined coating and developing treatments is complete.

The operative sequence of the aforesaid post-exposure baking unit 44 will be explained in detail. First, before starting the heat processing, the heating plate 65 is heated to a predetermined temperature according to a predetermined recipe.

When the heat processing starts, the lid body 62 is first raised by a not-shown drive mechanism. Then, the wafer W after the previous process, namely, after the exposure processing of a pattern is carried into the casing 61 by the main carrier device 13, and the wafer W is delivered to the hoisting and lowering pins 84 which are on standby at predetermined positions above the heating plate 65 in advance.

Next, the lid body 62 is lowered to form the process chamber S integrally with the heating plate accommodating section 63. At this moment, supplying of the inert gas from the blow-out ports 80a of the support ring 80 is started. The inert gas passes through the process chamber S to be exhausted from the exhaust portion 62a, thereby generating an airflow and purging the atmosphere inside the process chamber S until the heat processing completes.

Thereafter, the wafer W is lowered with the hoisting and lowering pins 84 by the hoisting and lowering drive mechanism 85 to be mounted onto the heating plate 65. The heat processing begins simultaneously with the wafer W being mounted onto the heating plate 64, and the wafer W is heated at a predetermined temperature for a predetermined time.

After the predetermined time, the wafer W is raised by the hoisting and lowering pins 84 to a predetermined position and the heating by the heating plate 65 is complete. Thereafter, the lid body 62 is raised again and the process chamber S is opened. Then, the wafer W is delivered from the hoisting and lowering pins 84 to the main carrier device 13 to be carried out of the inside of the casing 61, thereby completing a series of heat processings.

Incidentally, when the recipe of the wafer W is changed after the above-mentioned heat processing and the temperature of the heating plate 65 is changed downwardly, the temperature of the heating plate 65 decreases by natural radiation to become a target temperature. The present inventors have confirmed that, when the bolts 71 are provided by penetrating through the stepped portion 70a of the supporting member 70 as is conventional under the above situation, the aforesaid part of the supporting member 70 which is placed between the bolt 71 and the outer peripheral surface of the heating plate 65 shrinks inwardly to a great extent and partially compresses the heating plate 65. For this reason, there is a possibility that the heating plate 65 is distorted and unevenness of the temperature occurs on the surface of the heating plate 65 in the conventional art.

However, in this embodiment, the bolts 71 are provided at the inner peripheral surface of the stepped portion 70a of the supporting member 70 and the peripheries of the bolts 71 on the heating plate 65 side are exposed toward the heating plate 65 side, whereby the part of the supporting member 70 which is placed between the bolt 71 and the outer peripheral surface of the heating plate 65 to cause the distortion of the heating plate 65 as conventional does not exist. Thus, even when the temperature of the heating plate 65 is lowered, it is prevented that the part of the heating plate 65 is compressed to distort the heating plate 65.

Moreover, in the above embodiment, the collars 76 are provided to the bolts 71 so that the bolts 71 do not contact the supporting member 70 directly, thereby protecting the bolts 71 from the heat of the heating plate 65 or the supporting member 70 and maintaining the strength and the like of the bolts 71. Since the bolts 71 are usually made of metal, it is feared that friction is produced to generate particles by contacting the supporting member 70 directly, but the fear is eliminated by providing the collars 76.

Furthermore, since the plurality of the collars 76 are provided respectively to contact the outer peripheral surface of the heating plate 65, the heating plate 65 is held by the collars 76 from the outside so that the heating plate 65 is positioned and the erroneous deviation from a predetermined position is prevented. Therefore, the wafer W can be mounted at the predetermined position on the heating plate 65 at all times.

PTFE (polytetrafluoroethylene) which is excellent in heat insulating property is used as the material of the collars 76 so that the heat of the heating plate 65 is radiated from the collar 76, thereby preventing the temperature of the heating plate 65 from becoming unstable. Incidentally, since any heat insulating material will do as the material of the collars 76, for example, PTFE (polytetrafluoroethylene) containing glass, the polyimide resin or the like may be used as its material.

As in the aforesaid embodiment, by providing the O-rings 78 having elasticity between the supporting member 70 and the supporter 74, even when expansion/contraction and deformation of the supporting member 70 or the supporter 74 occur by the heat, the displacement is relieved by the O-rings 78 and hence, the influences on each other can be kept to a minimum. Therefore, deformation of the heating plate 65 which is caused by the deformations of both of these is inhibited. Incidentally, since any intermediate member will do as long as it can relieve the displacements of the supporting member 70 and the supporter 74, another intermediate member, such as a thin rubber plate may be used. In this case, the rubber plate is disposed between the supporting member 70 and the supporter 74 to relieve the displacements of both of them.

Figure 9:
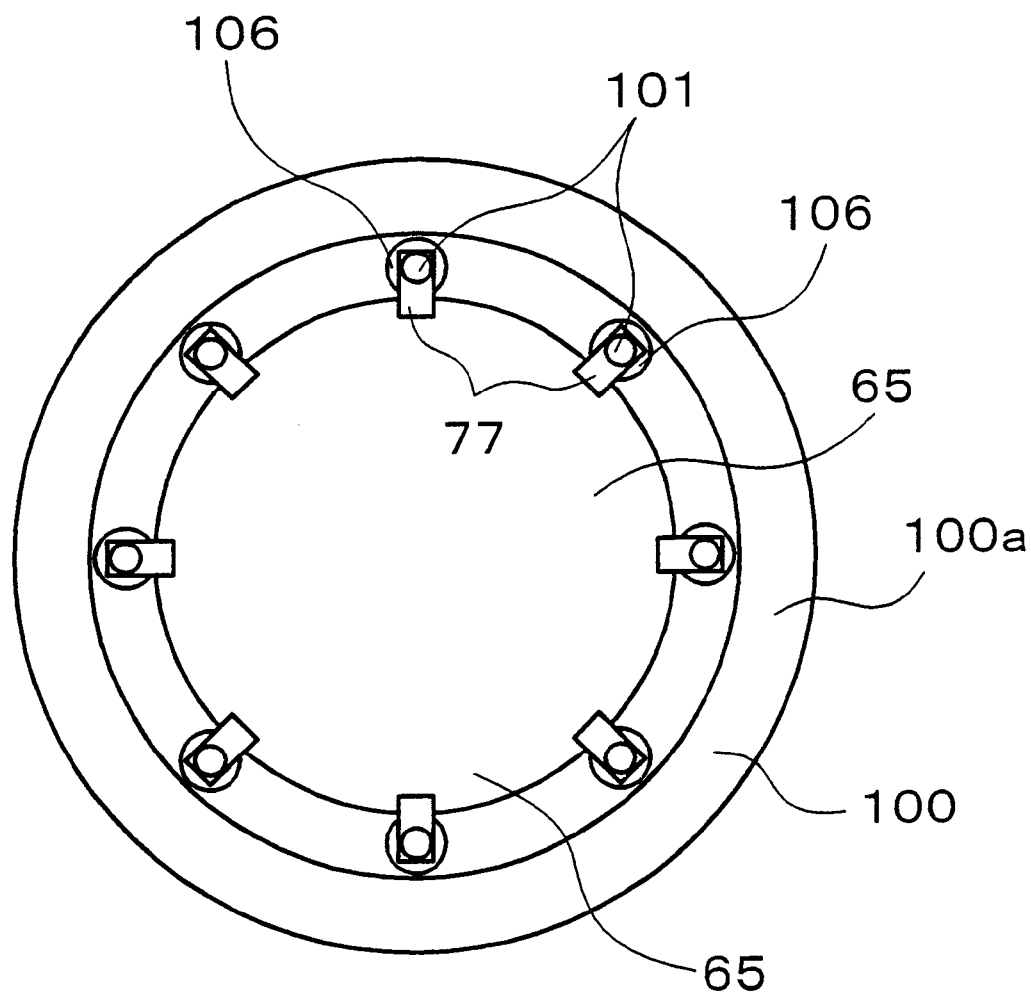
FIG. 9 is a plane explanatory view of a periphery of the supporting member showing another form of positions of bolts for fixing the supporting member and the supporter.
Figure 10:
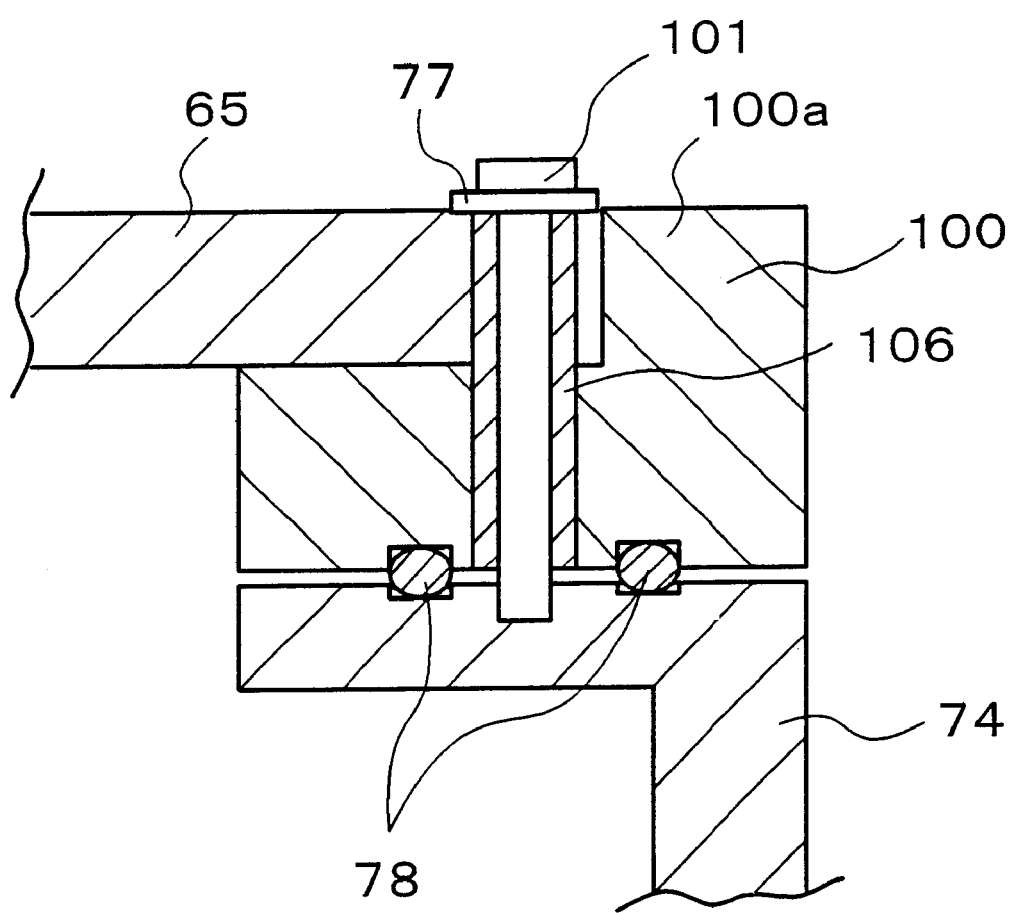
FIG. 10 is an explanatory view showing an enlarged vertical section of a fixing portion of the supporting member and the heating plate in FIG. 9.

Although the bolts 71 are provided at the inner peripheral surface of the stepped portion 70a in the above embodiment, it is also suitable to provide bolts 101 between an inner peripheral surface of a stepped portion 100a of a supporting member 100 and the outer peripheral surface of the heating plate 65, as shown in FIG. 9 and FIG. 10. Namely, the entire bolt 101 may be provided on an inner side from the inner peripheral surface of the stepped portion 100a to completely protrude from a surface of an inner side of the support member 100. In this case, it is also possible to prevent the deformation of the heating plate 65 because the heating plate 65 is not partially compressed by shrinking of the supporting member 100, similarly to the aforesaid embodiment. Moreover, it is suitable to attach collars 106 to the bolts 101 so that the heating plate 65 is held by the collars 106 from the outside, similarly to the aforesaid embodiment. Thereby, the heating plate 65 is fixed to a predetermined position by the collars 106.

Figure 11:
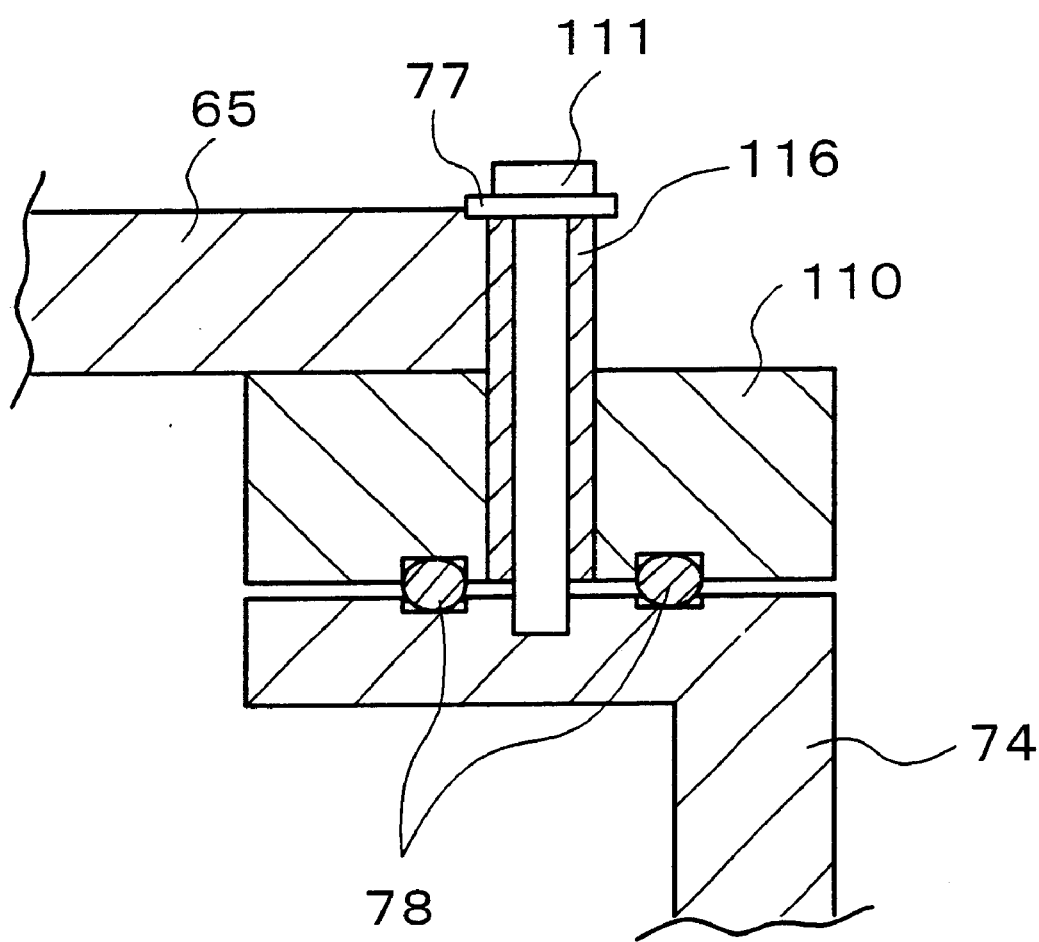
FIG. 11 is an explanatory view of a vertical section showing another form of the supporting member in FIG. 10.

Since the aforesaid supporting member 100 does not actually contact the outer peripheral surface of the heating plate 65 and perform a function of positioning of the heating plate 65, it is also suitable to be in a shape to support only the lower surface of the periphery of the heating plate 65, as shown in FIG. 11. A supporting member 110 is formed in a ring shape without a stepped portion so as to support only the lower surface of the periphery of the heating plate 65, and is provided between the heating plate 65 and the supporter 74. The rest of the structure is the same with that of the aforesaid embodiment, in which the supporting member 110 is fixed to the supporter 74 by bolts 111 with collars 116 penetrating in the vertical direction, and the heating plate 65 is positioned by the collars 116. In the case like this, since a part of the supporting member which compresses the outer peripheral surface of the heating plate 65 does not exist from the beginning, the deformation and the like of the heating plate 65 can be completely prevented.

Figure 12:
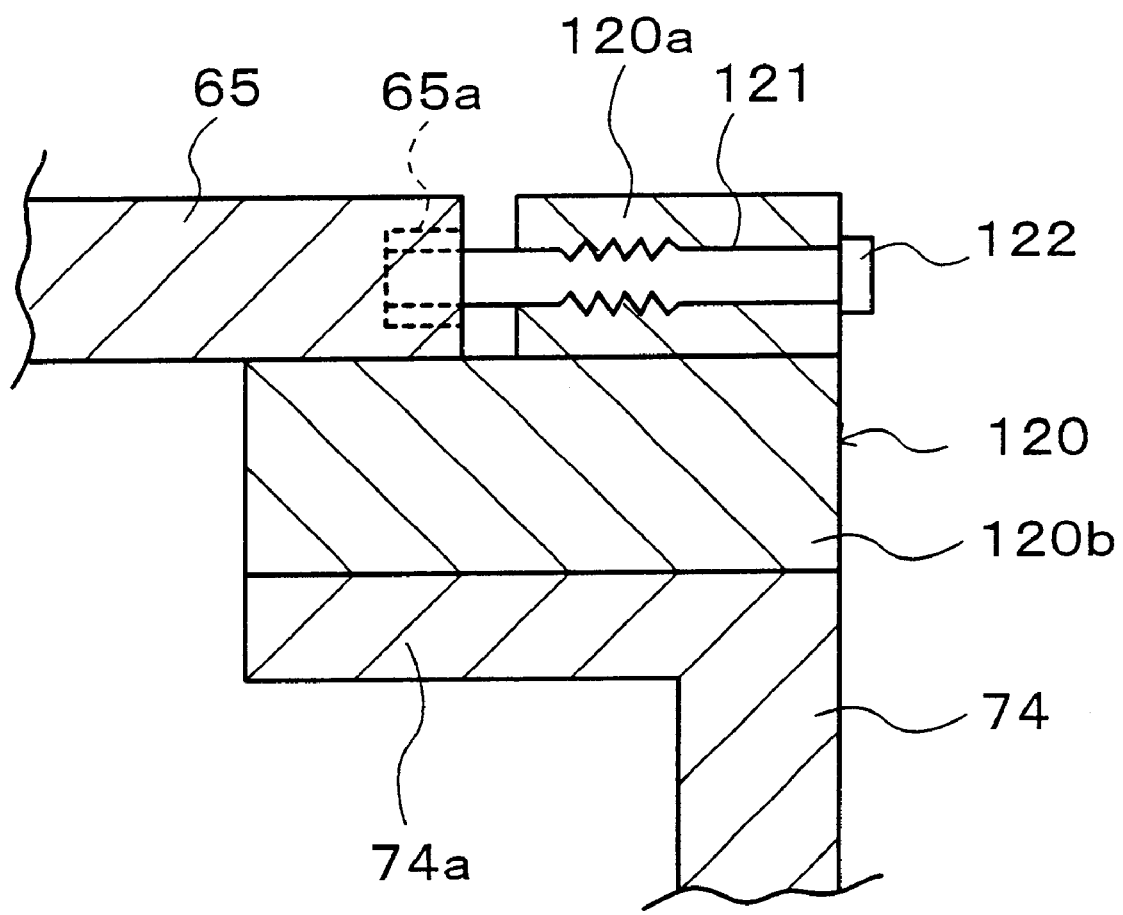
FIG. 12 is an explanatory view of an enlarged vertical section of a fixing portion of the supporting member and the heating plate when the bolts are provided horizontally.
Figure 13:
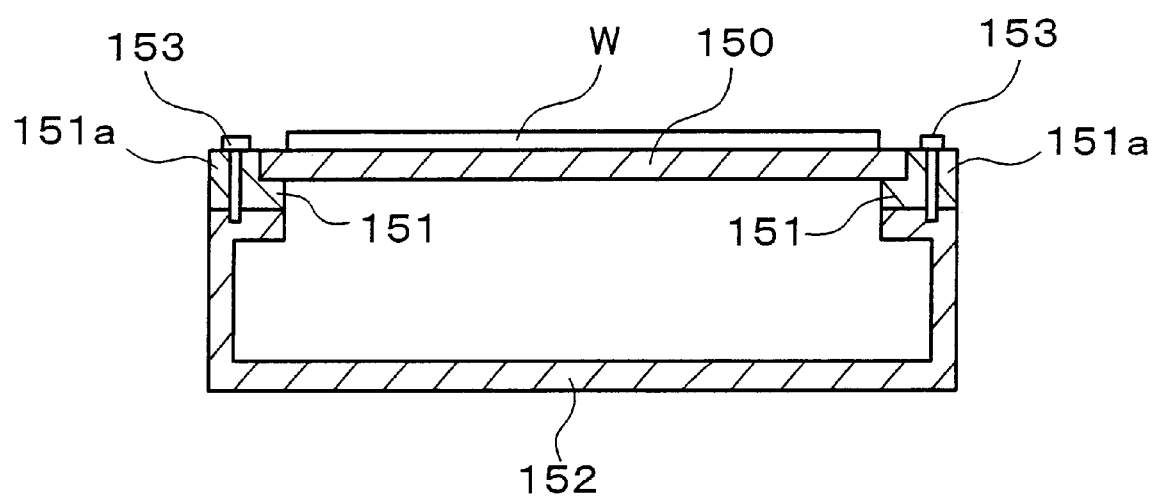
FIG. 13 is an explanatory view of a vertical section in a periphery of the supporting member showing a conventional fixing method of the supporting member.
Figure 14:
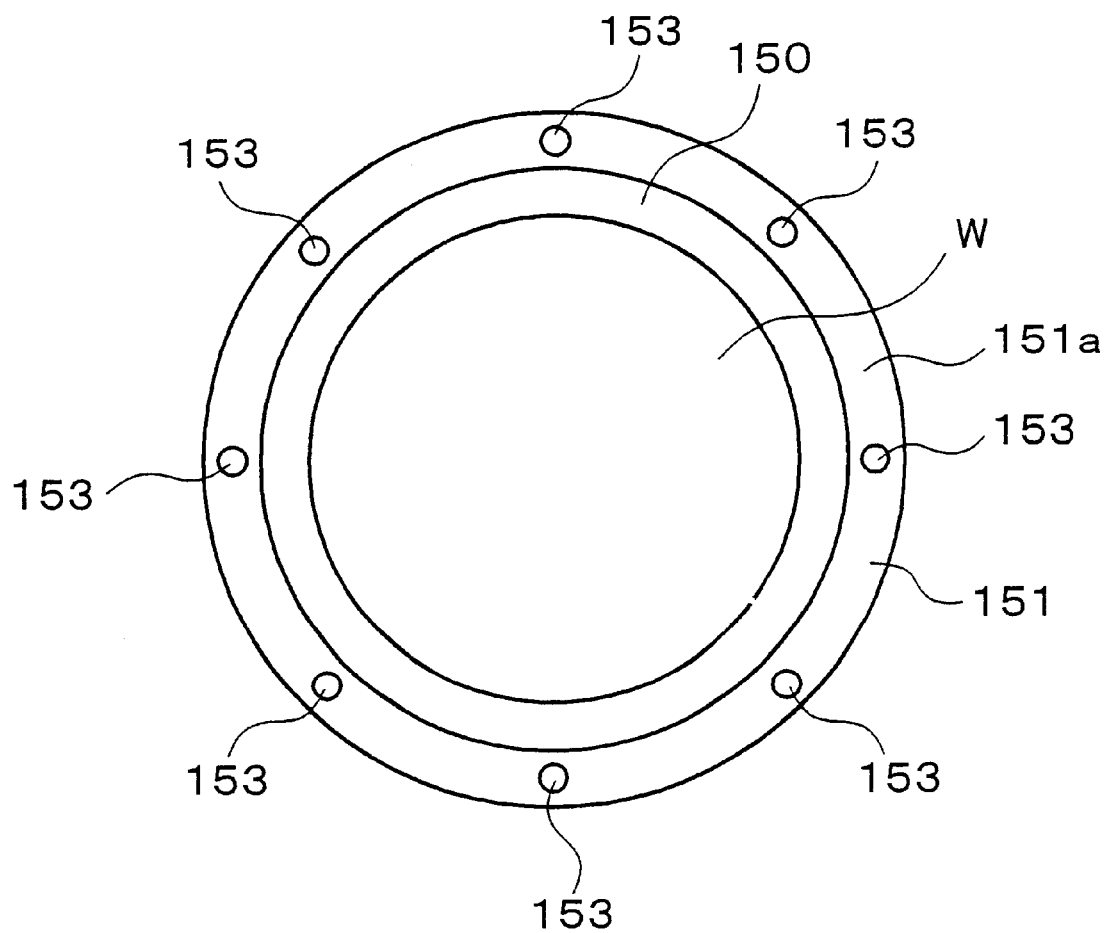
FIG. 14 is a plane explanatory view in the periphery of the supporting member showing the conventional fixing method of the supporting member.
Figure 15:
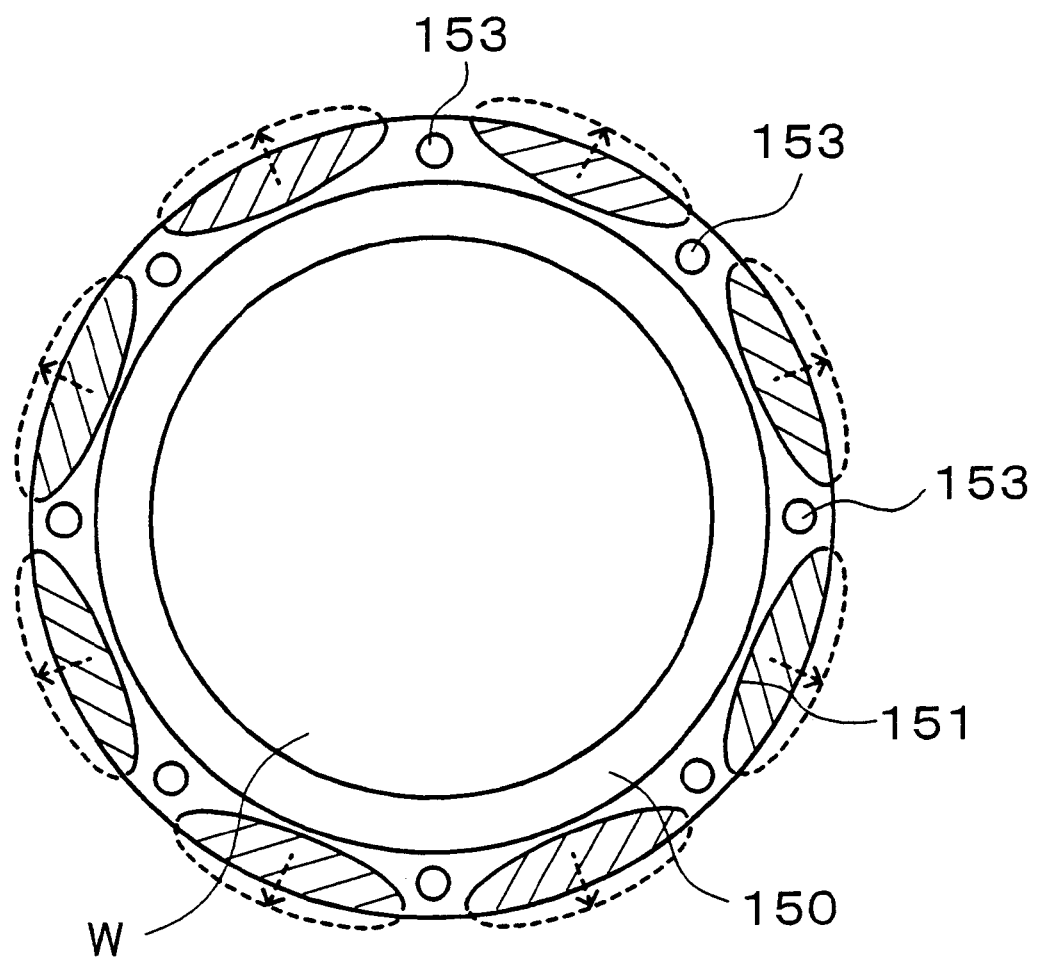
FIG. 15 is an explanatory view showing an example of expansion of the supporting member when the supporting member in FIG. 14 is heated.
Figure 16:
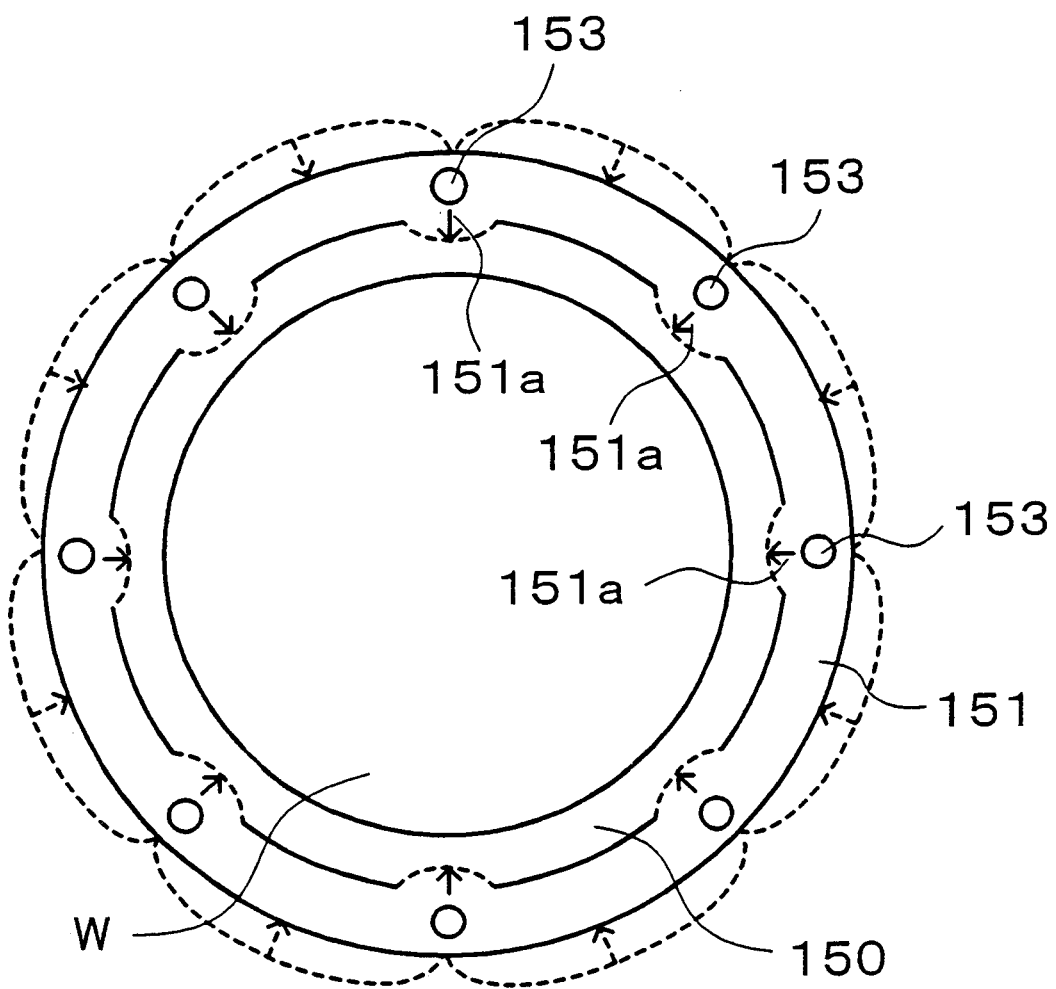
FIG. 16 is an explanatory view showing an example of shrinking of the supporting member when the heated supporting member in FIG. 15 is cooled.

Further, in the above embodiment, the bolts 71 are provided vertically to fix the supporting member 70 to the supporter 74, but it is also suitable to provide threaded holes 121 horizontally from the outside of a supporting member 120 toward the inside thereof and provide bolts 122 as fixing members therein, as shown in FIG. 12. Here, an upper portion 120a of the supporting member 120 through which the bolts 120 are penetrated is made of metal having a small thermal expansion coefficient, and a lower portion 120b of the supporting member 120 is made of resin having excellent heat insulting property.

Here, the bolts 122 are inserted into the threaded holes 121 from the outside to fix the bolts 122 and the supporting member 120 first, and protruding end parts of the bolts 122 are inserted into a cut-out portion 65a in the outer peripheral surface of the heating plate 65 to hold the heating plate 65 by the protruding end parts, thereby fixing the heating plate 65. Further, the upper portion 120a and the lower portion 120b of the supporting member 120 and the lower portion 120b and the supporter 74 are preferably attached by using, for example, an adhesive so as not to impose loads vertically. Thereby, it is prevented that the lower portion 120b and the upper portion 120a of the supporting member 120 are deformed corresponding to the distortion of the supporter 74 to deform the heating plate 65.

It should be noted that, although the above embodiment is embodied as the heating unit for operating post-exposure baking, it may certainly be the other heating units such as the prebaking unit, the post-baking unit and the like. Moreover, although the wafer is used as the substrate, the present invention can be surely applied to the other substrates, for example, to the heating unit of an LCD substrate.

According to the present invention, since the part of the supporting member does not exist between the fixing members and the outer peripheral surface of the heating plate, contrary to the conventional art, the compression and the deformation of the heating plate can be prevented even when the heating plate is cooled. Therefore, the heating of the substrate by this heating plate is preferably operated, thereby enhancing yields.

Further, by attaching the collars to the fixing members, the fixing members are prevented from contacting the supporting member directly, and hence an adverse effect which is exerted upon the fixing members by the heat of the supporting member and the heating plate is inhibited. Furthermore, generation of the particles by the friction of the fixing members and the supporting member is prevented.

Moreover, since the part of the collar is provided to contact the outer peripheral surface of the heating plate, the heating plate is positioned and further, the erroneous deviation of the heating plate from the predetermined position is prevented. Therefore, the heat processing of the substrate is preferably operated, thereby enhancing the yields.

When using the heat insulting material as the material of the collars, the collars can perform the function as a part of the supporting member which is used as the heat insulting material. Therefore, an environment in which the heat of the heating plate is hard to radiate is prepared and the substrate can be heated by the heating plate the temperature of which is maintained in a predetermined manner.

In the case where the intermediate member is provided between the supporting member and the supporter, even when the expansion/contraction and the deformation of the supporting member or the supporter occur by external sources such as the heat, the displacement is relieved by the intermediate member and hence, the influences on each other can be kept to a minimum. As this result, the deformation of the heating plate which is caused by the deformations of both of them is inhibited.

What is claimed is:

1. An apparatus for operating heat processing to a substrate, comprising
   a heating plate having a lower edge and a circumferential side wall, to mount and heat the substrate thereon;
   a supporting member to support the lower edge of said heating plate; and
   a supporter to support said supporting member, wherein said supporting member has a stepped portion to surround the circumferential side wall of said heating plate, wherein said supporting member is fixed to said supporter by a fixing member penetrating through the stepped portion in a vertical direction, and wherein a peripheral side wall of the fixing member on a side to be opposed to the circumferential side wall of said heating plate is exposed toward the circumferential side wall of the heating plate.

2. An apparatus as set forth in claim 1, wherein a collar is provided to the peripheral side wall of the fixing member.

3. An apparatus as set forth in claim 2, wherein a part of a peripheral side wall of the collar contacts the circumferential side wall of said heating plate.

4. An apparatus as set forth in claim 2, wherein the collar is made of a heat insulating material.

5. An apparatus as set forth in claim 2, wherein the collar is made of a polyimide resin.

6. An apparatus as set forth in claim 1, further comprising:

an intermediate member having elasticity between said supporting member and said supporter.

7. An apparatus for operating heat processing to a substrate, comprising:

a heating plate having a lower edge and a circumferential side wall, to mount and heat the substrate thereon;

a supporting member to support the lower edge of said heating plate; and a supporter to support said supporting member, wherein said supporting member has a stepped portion to surround the circumferential side wall of said heating plate, wherein said supporting member is fixed to said supporter by a fixing member penetrating through the stepped portion in a vertical direction, and wherein the fixing member is provided between an inner side wall of the stepped portion and the circumferential side wall of said heating plate.

8. An apparatus as set forth in claim 7, wherein a collar is provided to a peripheral side wall of the fixing member.

9. An apparatus as set forth in claim 8, wherein a part of a peripheral side wall of the collar contacts the circumferential side wall of said heating plate.

10. An apparatus as set forth in claim 8, wherein the collar is made of a heat insulating material.

11. An apparatus as set forth in claim 8, wherein the collar is made of a polyimide resin.

12. An apparatus as set forth in claim 7, further comprising:

an intermediate member having elasticity between said supporting member and said supporter.

13. An apparatus for operating heat processing to a substrate, comprising:

a heating plate having a lower edge and a circumferential side wall, to mount and heat the substrate thereon;

a supporting member to support the lower edge of said heating plate; and a supporter to support said supporting member, wherein said supporting member has a stepped portion to surround the circumferential side wall of said heating plate, wherein said supporting member is fixed to said supporter by a fixing member penetrating through the stepped portion in a vertical direction, and wherein the fixing member is adjacently provided facing outside the circumferential side wall of said heating plate.

14. An apparatus as set forth in claim 13, wherein a collar is provided to a peripheral side wall of the fixing member.

15. An apparatus as set forth in claim 14, wherein a part of a peripheral side wall of the collar contacts the circumferential side wall of said heating plate.

16. An apparatus as set forth in claim 14, wherein the collar is made of a heat insulating material.

17. An apparatus as set forth in claim 14, wherein the collar is made of a polyimide resin.

18. An apparatus as set forth in claim 13, further comprising:

an intermediate member having elasticity between said supporting member and said supporter.

19. An apparatus for operating heat processing to a substrate, comprising:

a heating plate having a lower edge and a circumferential side wall, to mount and heat the substrate thereon;

a supporting member having a stepped portion to surround the circumferential side wall of said heating plate, to support the lower edge of said heating plate; and a supporter to support said supporting member, said supporting member including a through-hole penetrating in a horizontal direction from an outside of the stepped portion toward an inside thereof; and the apparatus further comprising:

a fixing member being fixed to said supporting member by penetrating through the through-hole to fix said heating plate by pressing the circumferential side wall.

20. An apparatus as set forth in claim 19, further comprising:

an intermediate member having elasticity between said supporting member and said supporter.

* * * * *